(12) United States Patent
Aoyama

(10) Patent No.: US 7,485,975 B2
(45) Date of Patent: Feb. 3, 2009

(54) ALIGNMENT ERROR MEASURING MARK AND METHOD FOR MANUFACTURING SEMICONDUCTOR DEVICE USING THE SAME

(75) Inventor: Ryoichi Aoyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 164 days.

(21) Appl. No.: 11/499,699

(22) Filed: Aug. 7, 2006

(65) Prior Publication Data

US 2007/0035040 A1 Feb. 15, 2007

(30) Foreign Application Priority Data

Aug. 12, 2005 (JP) ............................. 2005-234390

(51) Int. Cl.
*H01L 23/544* (2006.01)
(52) U.S. Cl. ............... 257/797; 257/797; 257/E23.179; 438/401; 438/462
(58) Field of Classification Search ................. 257/797, 257/E23.179; 438/401, 462
See application file for complete search history.

(56) References Cited

U.S. PATENT DOCUMENTS 6,143,622 A * 11/2000 Yamamoto et al. .......... 438/401

FOREIGN PATENT DOCUMENTS

| JP | 09-074063 | 3/1997 |
|----|-----------|--------|
| JP | 2004-134473 | 4/2004 |
| JP | 2004-134474 | 4/2004 |

* cited by examiner

*Primary Examiner*—Leonardo Andújar
*Assistant Examiner*—Tucker Wright
(74) *Attorney, Agent, or Firm*—Rabin & Berdo, PC

(57) ABSTRACT

The object of the present invention is providing an alignment error measuring mark for an accurate alignment in a metal photolithography process.

A substrate reference mark 110 is produced by forming a concavity by an erosion caused from a chemical mechanical polishing a tungsten on a surface of a interlayer film 132 after holes for substrate reference mark 111 is formed on the interlayer film 132 at a predetermined density and the tungsten is deposited in the holes for substrate reference mark 111 and on the interlayer film 132. A resist reference mark is formed on a resist film 134 on the substrate reference mark 110 and in a shape of a rectangular shape having a different size from the one of the substrate reference mark 110. Since the substrate reference mark 110 is formed by the concavity from the erosion, a position of an edge 133a of the concavity of a aluminum film 133 can be aligned to a position of an edge 110a of the concavity of the substrate reference mark 110. Consequently, an alignment error can be accurately detected by measuring the position of the edge 133a and a position of a resist reference mark 120.

7 Claims, 12 Drawing Sheets

(A)

(B)

(A)

(B)

(A)

(B)

(A)

(B)

(A)

Aliminum particle ↓

Real center of mark (B)

Aliminum particle ↙

Real center of mark | Measuring result of center of mark

ALIGNMENT ERROR MEASURING MARK AND METHOD FOR MANUFACTURING SEMICONDUCTOR DEVICE USING THE SAME

BACKGROUND OF THE INVENTION

The present invention relates to an alignment error measuring mark and a method for manufacturing semiconductor devices using the mark thereof. For more detail, the present invention relates to an improvement of alignment technology for a photolithography process.

In the manufacturing process for semiconductors, processes for etching target films or infusion of impurity are repeated, and a requested semiconductor integrated circuits are manufactured thereby. In the photolithography process thereof, resist films are formed through a coating process for forming a resist film on the wafer surface, an exposure process for drawing one-layer patterns on the resist film thereof, and a developing process for developing exposed films. In the exposure process thereof, a positioning relationship between circuit patterns formed on a substrate (a film under the target film, for example, processed by the above resist pattern) and circuit patterns formed on the target films needs to be controlled precisely. For the above purpose, precisely controlled alignment is done in the exposure process by an alignment error measuring mark.

A general alignment error measuring mark includes a mark formed on a substrate (substrate reference mark) and a mark formed on a resist pattern (resist reference mark). An alignment error of the resist patterns thereof can be detected by measuring a displacement between the substrate reference mark and the resist reference mark, based on the above alignment error measuring mark.

As alignment error measuring marks, the ones described in the following patent documents 1-3 are commonly known, for example.

According to the technology of the patent document 1, the substrate reference mark (referred to as "the first measuring mark 100" in the above patent document) is formed by placing thereof in a shape of rectangular frame (for example, refer to FIG. 1 of the above patent document).

According to the technology of the patent document 2, the substrate reference mark (referred to as "line mark WM" in the above cited document) is formed by placing a plural of line patterns in the directions of X, Y at the given interval (refer to paragraph 0059 and FIG. 2, for example, in the above cited document). Furthermore, according to the technology of the patent document 2, the placement interval of the line patterns thereof is determined so that erosion rarely occurs (refer to paragraph 0047, for example, in the above cited document).

Additionally, according to the technology of the patent document 3, the substrate reference mark is formed by placing a plurality of line patterns in the directions of X, Y at the given interval, wherein the inner half of the line patterns and the outer half thereof are varied with symmetry, step, and line width, etc (refer to paragraph 0036, and FIG. 3, for example, in the above cited document). Furthermore, according to the technology of the patent document 3, the placement interval of the line patterns thereof is determined so that erosion rarely occurs (refer to paragraph 0055, for example, in the above cited document), as well as the technology of the patent document 2.

According to the technologies of the patent documents 1-3, the alignment errors are detected by measuring optically positions of the substrate reference mark and the resist reference mark at the same time (refer to FIG. 2 and paragraphs 0024-0026, for example, in the above cited document).

At the same time, in the photolithography process (process for forming the wiring pattern on the substrate), the substrate reference mark and the resist reference mark can not be measured simultaneously. The reason is that the film being processed is made of metal material and the transparency thereof is poor. Consequently, in the metal photolithography process, an alignment error measuring mark referred to as "box-in box type" is used to form a step of the film processed therein on the step of the substrate reference mark.

FIG. 11 is a schematic diagram showing a structure of the step measuring mark used in the conventional metal photolithography process, and the diagram (A) is a top-view diagram and the diagram (B) is a cross section diagram. As shown in the FIG. 11(B), the inter layer film 1102 is deposited on the semiconductor wafer 1101. Furthermore, the contact hole for multi-wiring (not shown in the diagram) is formed in the above inter layer film 1102, and the hole 1103 for the alignment error measuring mark is formed at the same time. Additionally, in the contact hole and the hole 1103 the conductive material of the plug (Tungsten in the case thereof) 1104 is built in. At the above time point, on the upper surface of the hole 1103, the concavity is formed as the substrate reference mark 1105. Then, the conductive material for forming a wiring pattern (Alminum in the case thereof) 1106 is deposited by sputtering, etc. on the whole surface of the interlayer film. Simultaneously, the concavity 1107 of the alminum film 1106 is formed on the substrate reference mark 1105. Additionally, the resist film 1108 is formed on the alminum film 1106. Then the resist pattern (not shown in the diagram thereof) is formed on the resist film 1108 and the resist reference mark is formed 1109 at the same time.

According to the above mentioned configuration, the concavity 1107 of the alminum film 1106 and the resist reference mark 1109 can be measured optically at the same time. Subsequently, the alignment error thereof can be detected.

Patent document 1: Japanese Patent Journal No. H9-74063

Patent document 2: Japanese Patent Journal No. 2004-134473

Patent document 3: Japanese Patent Journal No. 2004-134474

SUMMARY OF THE INVENTION

In the alignment error measuring mark shown in FIG. 11, however, there is a disadvantage that a precise alignment error measuring can not be done because a placement error between the substrate reference mark 1105 and the concavity 1107 arises. The reason thereof is that the thickness of the alminum 1106 becomes variable because the different collision angles of the alminum particles varies with the position on the semiconductor wafer 1101.

An alminum atom collide to the semiconductor wafer 1101 thereof in the approximately vertical direction on the substrate reference mark 1105 place around the center of the semiconductor wafer 1101. Then, the center of the substrate mark 1105 and the center of the concavity 1107 matches each other approximately. Consequently, an alignment error measuring having enough precision can be conducted by using the concavity 1107 and the resist reference mark 1109 (refer to FIG. 11).

On the contrary, on the substrate reference mark 1105 placed around the outer edge of the semiconductor wafer 1101, the collision angle of the atoms becomes large. Therefore, as shown in FIG. 12 (B), the center of the substrate mark 1105 and the center of the concavity 1107 are misaligned. That is, in the above case, an accurate measurement cannot be done, because the placement per se of the concavity 1107 for the reference of the alignment error measuring thereof is misaligned.

The collision angle becomes larger in proportion as the collision site becomes closer to the outer edge of the semiconductor wafer 1101. Consequently, the misalignment of the concavity 1107 becomes larger in proportion as the placement thereof becomes closer to the outer edge of the semiconductor wafer 1101, in the same way.

If the misalignment of the concavity 1107 can be adjusted, it becomes practicable to do a highly precise alignment error measuring. As mentioned before, however, in the metal photolithography process, the substrate reference mark 1105 cannot be optically observed, then it is not practicable to measure precisely the misalignment of the concavity 1107.

The object of the present invention is providing an alignment error mark for a precise alignment error measuring when the processed film therein has low transparency and a manufacturing method for semiconductor devices using the mark thereof.

(1) An alignment error measuring mark according to the claim 1 of the invention includes a plural of holes for substrate reference marking formed in a predetermined rectangular region of the inter layer at a given density, a substrate reference mark having conductive material put in the above holes for substrate reference marking and having a concavity in the above rectangular region, and a resist reference mark being formed on the substrate reference mark of the resist film, having a shape of rectangular frame, and having a different size from substrate reference mark.

(2) A manufacturing method for semiconductor according to claim 2 of the invention includes a first process, a second process, a third process, a fourth process, a fifth process, a sixth process, and a seventh process.

The first process forms a hole for inter layer wiring on an inter layer film of a semiconductor substrate, and a plural of holes for substrate reference marking being formed in the predetermined rectangular region of the inter layer film at the given density.

The second process deposits a first conductive material in the holes for inter layer wiring, in the holes for substrate reference marking, and on inter layer film.

The third process removes the first conductive material deposited on the interlayer film surface by chemical mechanical polishing, and forms the substrate reference mark having a concavity shape in the rectangular region by erosion being arisen by the chemical mechanical polishing.

The fourth process deposits a second conductive material in the hole for inter layer wiring, in the hole for substrate reference marking, and on the inter layer film.

The fifth process forms a resist film on a film of the second conductive material.

The sixth process forms an ecthing mask for processing the second conductive material film from the resist film by photolithography method, and forms a resist reference mark having a shape of rectangular frame and having a different size from the substrate reference mark from the film on the substrate reference mark by photolithography method.

The seventh process detects the alignment error of the etching masks by measuring the misalignment between the centers of the substrate reference mark and the resist reference mark.

According to the claim 1 and 2, since the concavity formed by erosion is used as a substrate reference mark, then misalignment between the substrate reference mark and the concavity of the processed film. Therefore, it is practicable to carry out a highly precise alignment error measuring.

DETAILED DESCRIPTION OF THE PREFERRED EMBODIMENT

Figure 1:
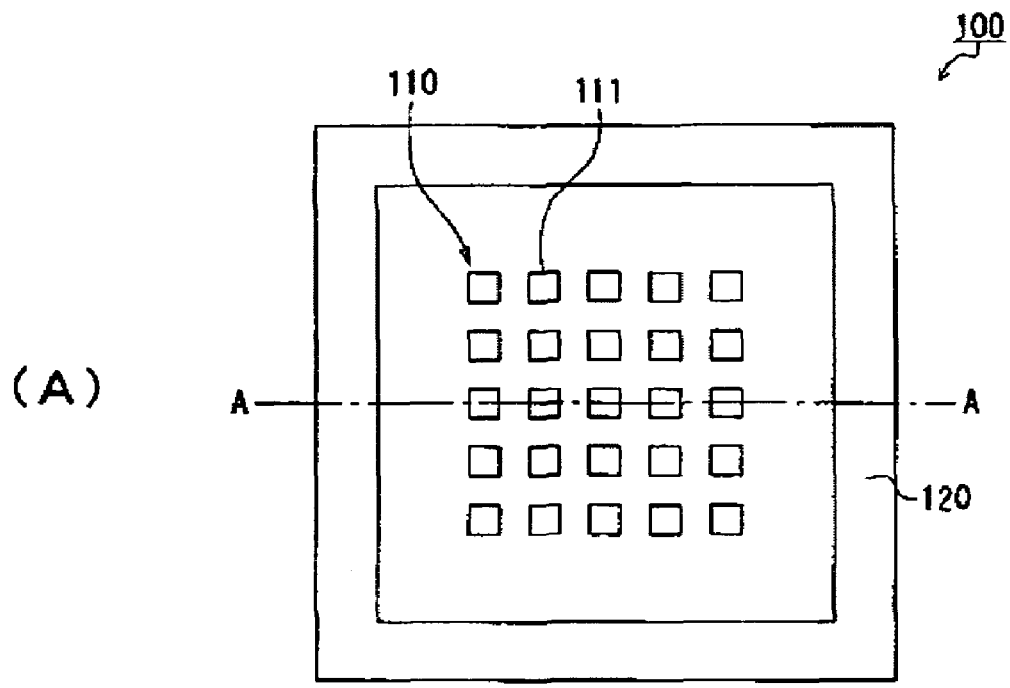
FIG. 1 is a schematic diagram showing a configuration of an alignment error measuring mark in accordance with the first embodiment of the invention. The figure of (A) is a top-view diagram. The figure of (B) is an A-A cross section.
Figure 1:
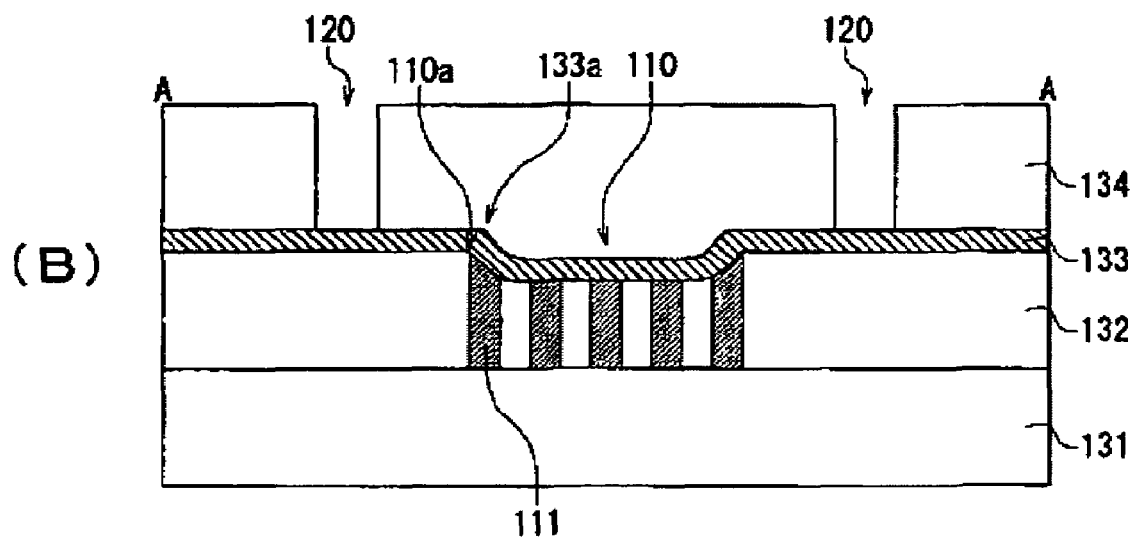

The embodiment of the invention will be explained using the drawings, as below. In the drawings, the size, shape, and placement of each element are shown only to the extent of understanding the present invention. At the same time, the numerical conditions explained as follows are no more than examples.

First Embodiment

The first embodiment of the present invention according to the first embodiment will be explained using FIGS. 1-4.

FIG. 1 is a schematic diagram showing a configuration of an alignment error measuring mark in accordance with the first embodiment of the invention. The figure of (A) is a top-view diagram. The figure of (B) is an A-A cross section.

As shown in FIG. 1(A), an alignment error measuring mark 100 according to the first embodiment of the invention consists of a substrate reference mark 110, and a resist reference mark 120.

The substrate reference mark 110 is formed by a concavity being arisen by chemical mechanical polishing the Tungsten being deposited in a hole 111 for the substrate reference mark 110 and on the surface of an interlayer film 132, after the interlayer film 132 is formed on a semiconductor wafer 131. A plurality of the above holes for substrate reference mark 111 are formed in the predetermined rectangular region of the interlayer film 132 at the given density. Erosion is a phenomenon resulting in a concavity in the whole region being densely full of holes and trenches by chemical mechanical over-polishing the region thereof. In FIG. 1, the holes 111 placed in a matrix of five by five piece are shown only to be simplified, however, more holes 111 are densely placed in reality. Since the substrate reference mark 110 is a concavity formed by erosion, the outer side thereof has a gentle slope. That is, the concavity has the bending shape having the smaller depth thereof in the outer side than the one in the center region, as shown in FIG. 1. In the outer side of the substrate reference mark an edge 110a is formed. The depth of the substrate reference mark 110 ranges typically from several hundreds to thousands angstroms, however, the depth thereof varies with the size of the substrate reference mark 110. Although the size of the substrate reference mark 110 is not limited, the depth of, for example, from 30 to 70 um is preferable in order to use directly the conventional alignment error measuring equipment. Additionally, the size, interval, and shape, etc. of the holes 111 can be set in order to arise an erosion by chemical mechanical polishing, and, for example, the size and interval thereof can be set corresponding to the smallest design rule for semiconductor manufacturing process (for example, 0.3 um), and the top view shape can be rectangular or circular.

An alminum film 133 is formed on a whole interlayer film 132 by, for example, sputtering, etc. Subsequently, the alminum film 133 is formed on the substrate mark 110, in the same way. As explained before, the outer edge of the substrate reference mark 110 has a gentle slope, then the position of a edge 133a of the alminum film 133 aligned to the position of a edge 110a of the substrate reference mark 110, practically. Ordinarily, the concavity of the aliminum film 133 having the depth of more than 300 angstrom is enough to detect optically the edge 133a.

The resist reference mark 120 is formed in the shape of rectangular frame on a resist film 134 of the substrate reference mark 110. The resist reference mark 120 according to the above embodiment of the invention has a larger size than the substrate reference mark 110. The size of the resist reference mark 120 is not especially limited, however, the outer edge size of from 70 to 80 um and the line width of more than 1 um are preferable in order to use the conventional alignment error measuring equipment. Furthermore, the size difference between the resist reference mark 120 and the substrate reference mark 110 having more than 10 um is preferable.

Figure 2:
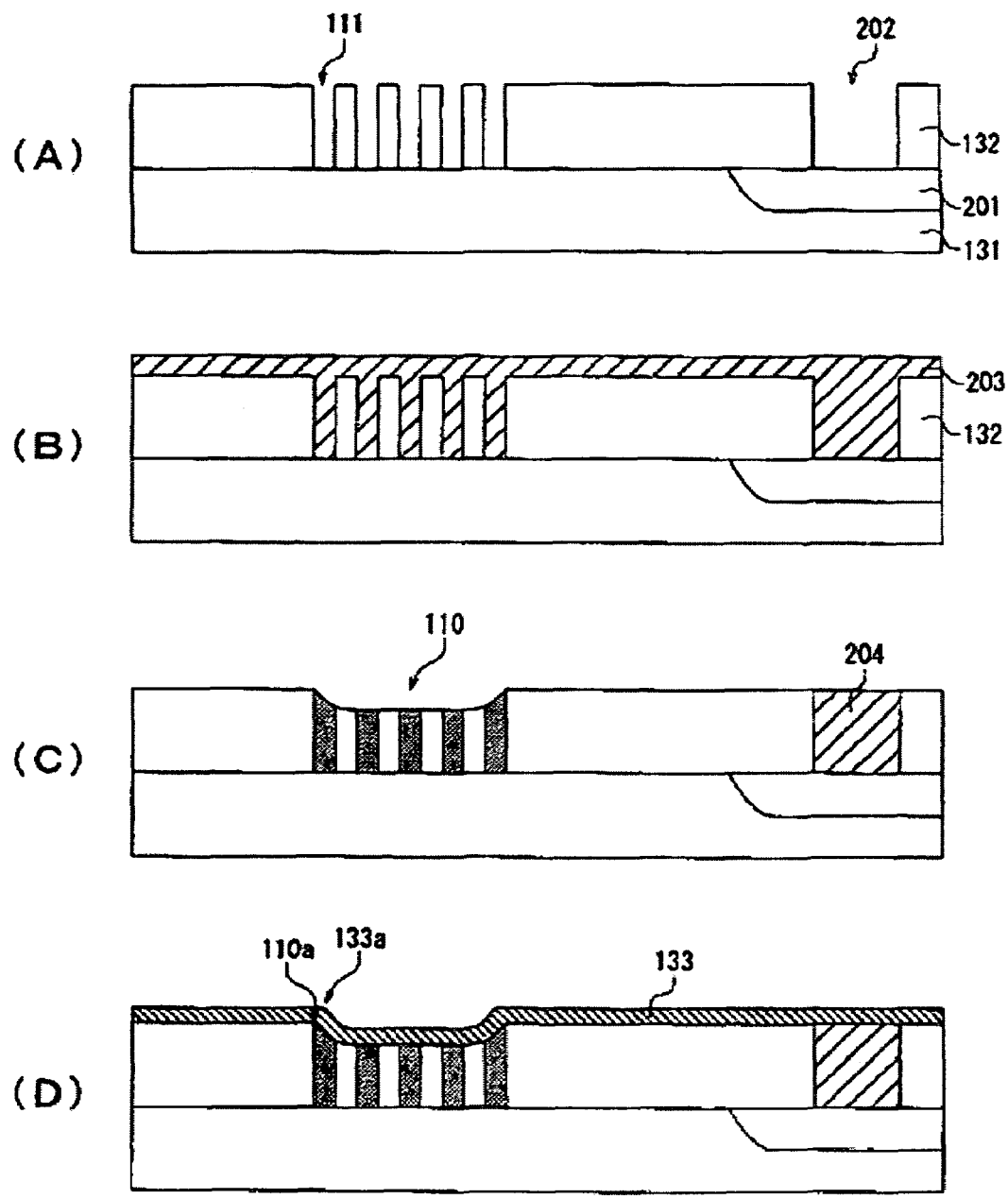
FIG. 2 is a cross section process diagram for explanation of a manufacturing method for semiconductor device in accordance with the first embodiment of the invention.
Figure 3:
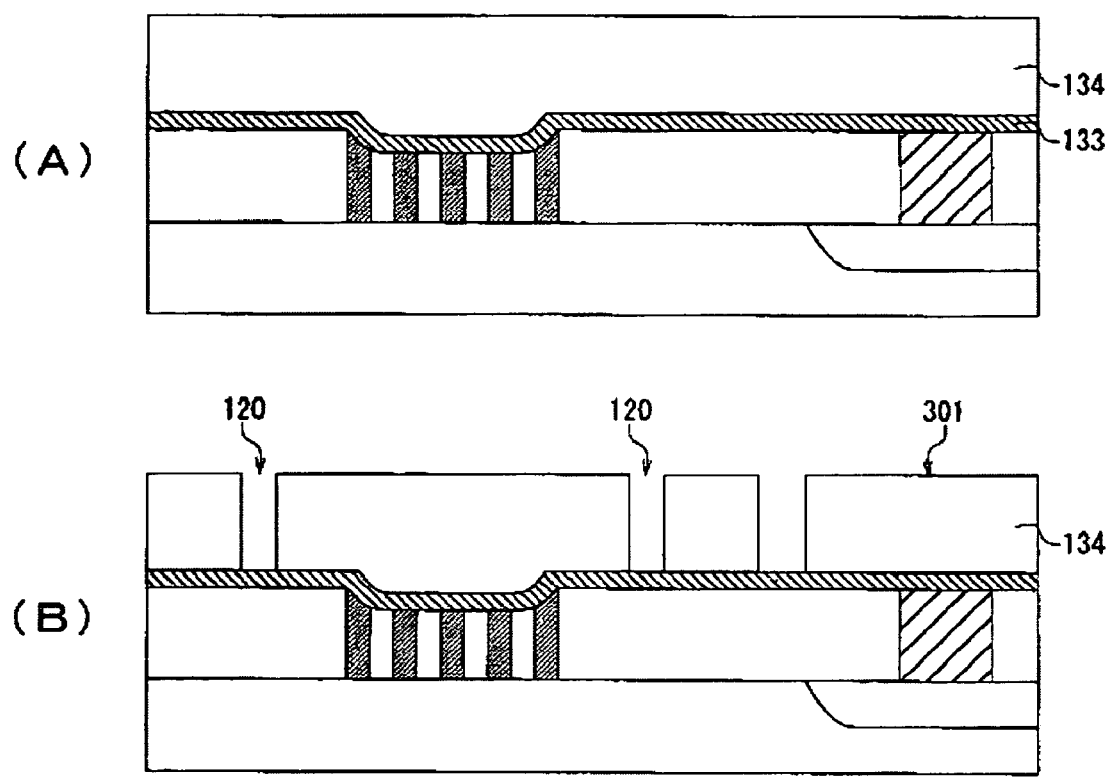
FIG. 3 is a cross section process diagram for explanation of a manufacturing method for semiconductor device in accordance with the first embodiment of the invention.

Secondly, the manufacturing method for semiconductor device according to the above embodiment of the invention will be explained as follows, using the cross section process diagrams of FIG. 2 and FIG. 3.

(1) First, after an impurity region 201, etc. is formed on a semiconductor 131, the interlayer film 132 is deposited by, for example, CVD (Chemical Vapor Deposition). Then, the contact holes 202 of a semiconductor integrated circuit 202 are formed on the interlayer film 132 and the holes for the substrate reference mark 111 are formed at the same time (refer to FIG. 2(A)).

Secondly, a tungsten 203 is deposited in the contact holes 202, in the holes for the substrate reference mark 111, and on the interlayer film 132 (refer to FIG. 2(B)).

(3) Subsequently, the tungsten 203 deposited on the surface of the interlayer film 132 is removed by chemical mechanical polishing. At the above time point, by an erosion caused by the above chemical mechanical polishing, a concavity is formed in the rectangular region having the formed holes for the substrate reference mark 111. Subsequently, forming of a tungsten plug 204 for interlayer wiring and the substrate reference mark 110 according to the present embodiment is finished (refer to FIG. 2(C).

(4) Subsequently, the alminum film 133 for forming a wiring pattern is deposited on the tungsten plug 204, the substrate reference mark 110 and the interlayer film 132, by, for example, sputtering, etc (refer to FIG. 2(D)). As explained before, when the sputtering, etc. is done, the collision angle of the aliminum atoms becomes larger in proportion as the collision site becomes closer to the outer edge of the semiconductor wafer 131. However, according to the present embodiment of the invention, since the substrate reference mark 110 is formed by an erosion caused by chemical mechanical polishing, the outer edge of the above substrate reference mark 110 has a gentle slope, and then the position of the edge 133a of the aliminum film 133 is aligned to the position of the edge 110a of the substrate reference mark 110, actually.

(5) Subsequently, a resist film 134 is formed on the aliminum film 133 (refer to FIG. 3(A)).

(6) Subsequently, an etching mask 301 for forming a wiring pattern is formed from the resist film 134, using photo-lithograph method, etc. Furthermore, the resist reference mark 120 is formed from the resist film 134 on the substrate reference mark 110 (refer to FIG. 3(B)), at the same time.

(7) Subsequently, the alignment error of the etching mask 301 is detected by measuring the misalignment between the substrate mark 110 and the resist reference mark 120, using the ordinary alignment error measuring equipment.

Figure 4:
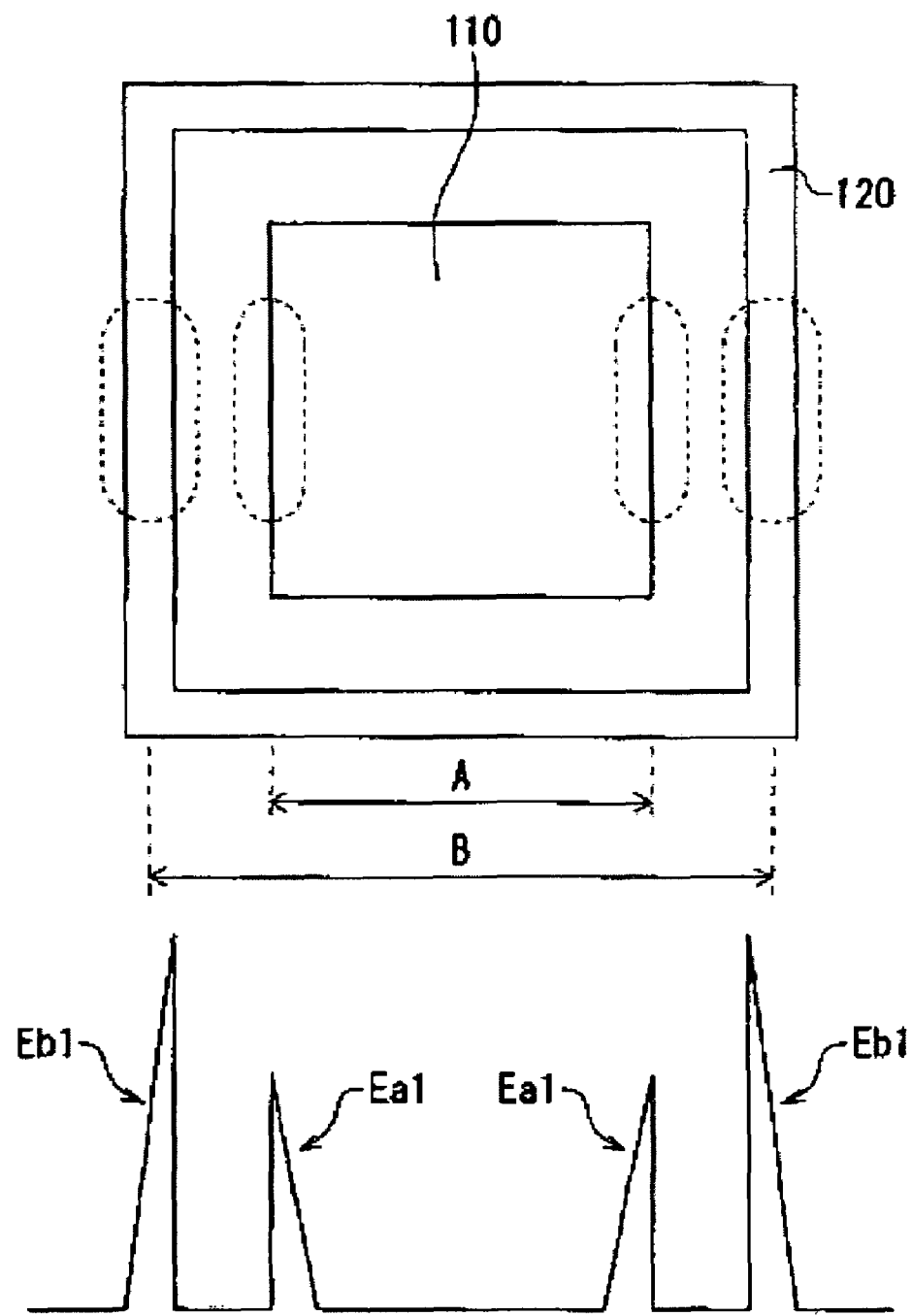
FIG. 4 is a schematic diagram for explanation of a measuring method for alignment error in accordance with the first embodiment of the invention.

FIG. 4 is a schematic diagram for explanation of the detecting method for the misalignment in the X axis direction between the substrate reference mark 110 and the resist reference mark 120.

As shown in FIG. 4, by the alignment error measuring equipment, a signal peak Ea1, Ea1 is observed at the position corresponding to the edge 133a of the aliminum film 133. As explained before, according to the present embodiment, at the equivalently same point as the edge 110a of the substrate reference mark 110, the edge 133a of the alminum film 133 is formed. Consequently, when the interval of the signal peak Ea1, Ea1 is represented as A, the center of the X axis of the substrate reference marl 110 is given as A/2.

At the same time, at the position corresponding to the resist reference mark 120, a signal peak Eb1, Eb1 is observed. When the interval of the signal peak Eb1, Eb1 is represented as B, the center of the X axis of the substrate reference marl 120 is given as B/2.

In the same way explained before, the misalignment delta Y of the resist reference mark 120 can be detected in the Y axis direction.

The aligner for photolithography of the resist film 134 is adjusted, using the above detecting results of delta X and delta Y. Therefore, the further alignment accuracy of photolithography of the semiconductor can be maintained.

As explained before, according to the present embodiment, since the concavity formed by the erosion is used as the substrate reference mark 110, there is no misalignment left between the above substrate reference mark 110 and the alminum film 133, and then the highly precise alignment error measuring can be practicable.

Second Embodiment

Figure 5:
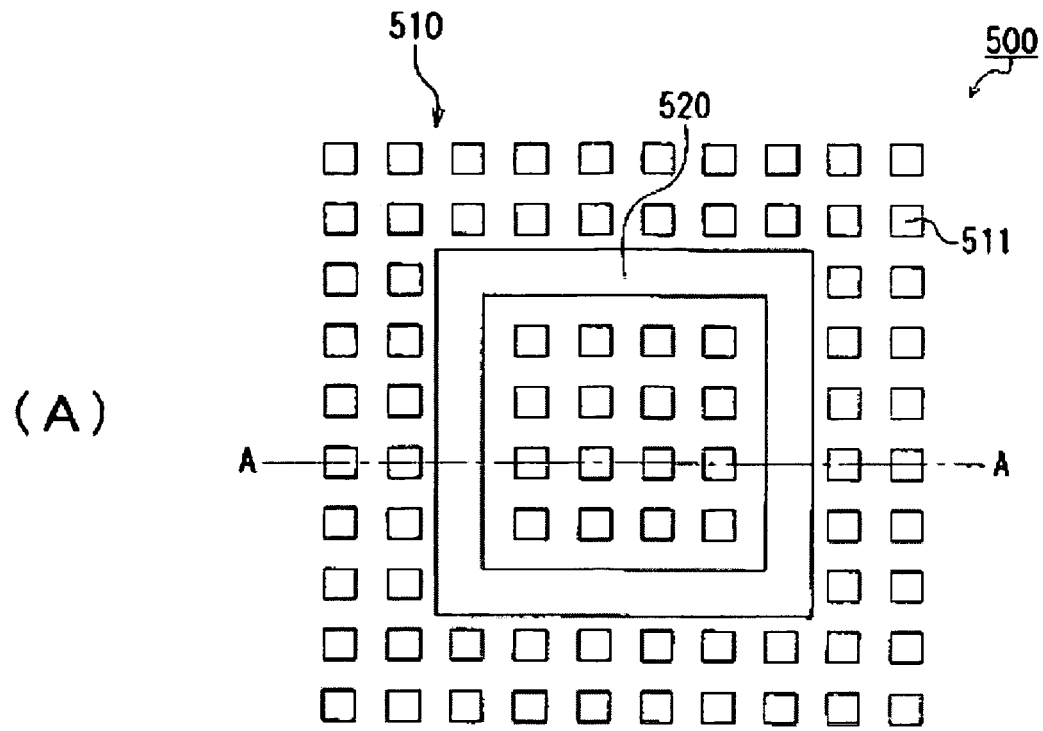
FIG. 5 is a schematic diagram showing a configuration of an alignment error measuring mark in accordance with the second embodiment of the invention. The figure of (A) is a top-view diagram. The figure of (B) is an A-A cross section.
Figure 5:
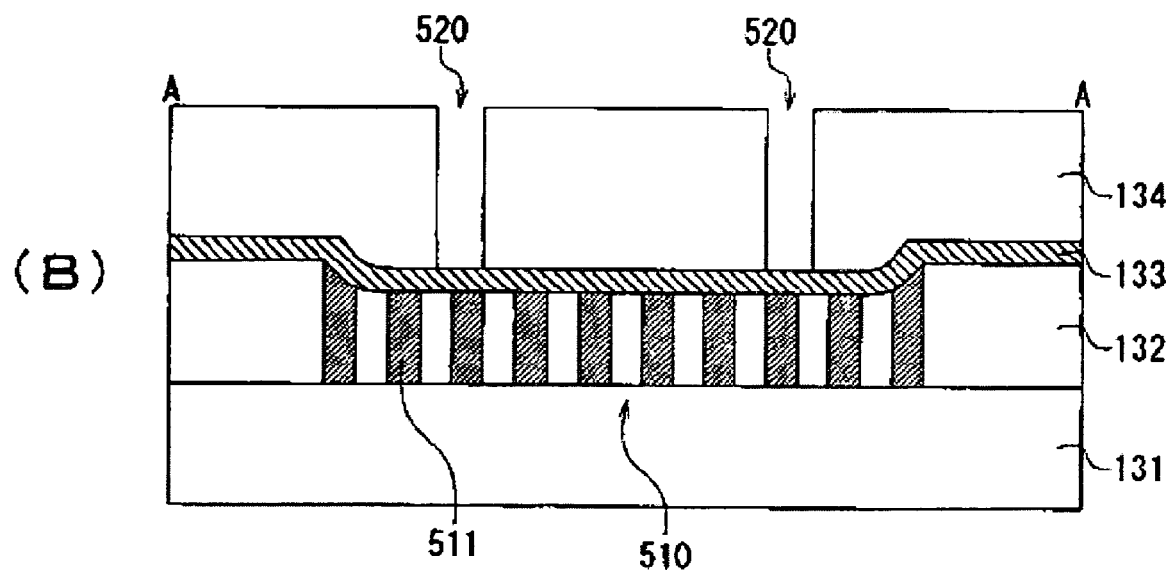

The second embodiment of the invention will be explained as below, using FIG. 5 and FIG. 6. FIG. 5 is a schematic diagram showing a configuration of an alignment error measuring mark in accordance with the second embodiment of the invention. The figure of (A) is a top-view diagram. The figure of (B) is an A-A cross section. In FIG. 5, the elements having the same numerical as in FIG. 1 are identical to the ones of FIG. 1.

As shown in FIG. 5, an alignment error measuring marl 500 according to the second embodiment includes an substrate reference mark 510, and a resist reference mark 520. The second embodiment is different from the first embodiment from the point that the outer edge size of the resist reference mark 520 is smaller than the size of the substrate reference mark 510.

As in the first embodiment, the substrate reference mark 510 can be formed by a concavity in the rectangular region caused by an erosion arising when a chemical mechanical polishing is done to the tungsten of the surface of the interlayer film 132 after the interlayer film 132 is formed on the semiconductor wafer 131, a plural of holes for substrate reference mark 511 is formed in the predetermined region of the above interlayer film 132 at the given density, and the tungsten is deposited in the above plural of holes for substrate reference mark 511 and on the above interlayer film 132. The size of the substrate reference mark 510 is not limited, however, the size of, for example, from 70 um to 80 um is preferable in order to use directly the conventional alignment error measuring equipment. Additionally, as in the first embodiment, the size, the interval, and the shape, etc., of the holes 511 can be determined so that an erosion is caused by the chemical mechanical polishing, although, the size and the interval thereof can be conformed to the smallest semiconductor manufacturing process rule (for example, 0.3 um), then the top view shape thereof can be rectangular or circular.

The resist reference mark 520 is formed on the resist film 134 on the substrate reference mark 510 in the shape of rectangular. As mentioned before, the above resist reference mark 520 has a smaller size than the substrate reference mark 510. The size of the resist reference mark 520 is not limited to a special range, however, in order to use directly the conventional align error measuring equipment, the outer edge size of from 30 um to 70 um and the line width of more than 1 um are preferable, furthermore, the size difference thereof from the substrate reference mark 510 of more than 10 um is preferable.

Since the manufacturing method according to the second embodiment is the same as the above mentioned method according to first embodiment, the explanation thereof is omitted.

Figure 6:
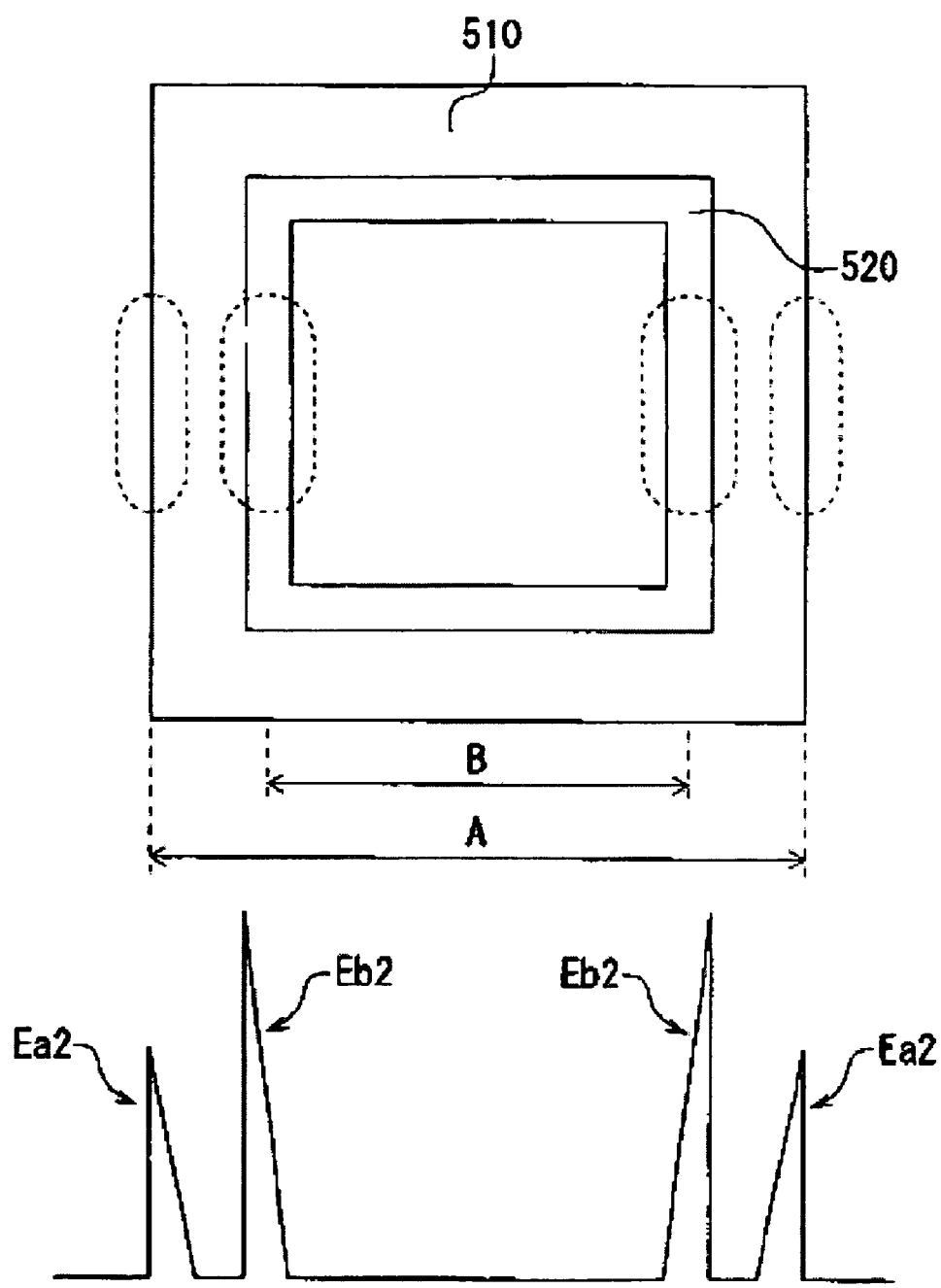
FIG. 6 is a schematic diagram for explanation of a measuring method for alignment error in accordance with the second embodiment of the invention.

FIG. 6 is a schematic diagram for explanation of a measuring method for misalignment between the substrate reference mark 510 the resist reference mark 520 in the X axis direction.

As shown in FIG. 6, the signal peak Ea2, Ea2 corresponding to the edge 133a of the alminum film 133 and the signal peak Eb2, Eb2 corresponding to the resist reference mark 520 are observed by the alignment error measuring equipment. As in the first embodiment, since the edge 133a of the alminum film 133 is formed actually in the same position as the edge of the substrate reference mark 510 in the second embodiment, the X axis center of the substrate reference mark 510 is represented as A/2, and the X axis center of the resist reference mark 520 is represented as B/2. Consequently, the difference between the A/2 and the B/2 is the X-axis-misalignment delta X of the resist reference mark 520.

In the same way explained before, the misalignment delta Y of the resist reference mark 520 can be detected in the Y axis direction.

The aligner for the photolithography of the resist film 134 can be adjusted using the above detecting results, the delta X and the delta Y. Consequently, the further alignment precision of the photolithography to the semiconductor wafer can be maintained.

According to the second embodiment, as in the first embodiment, since an concavity formed by an erosion is used as the substrate reference mark 510, there is very few misalignment between the above substrate reference mark 510 and the alminum film 133. Consequently, a highly precise alignment error measuring can be practicable.

Additionally, according to the second embodiment, compared with the first embodiment, it is easy to enlarge the size of the substrate reference mark 510. Therefore, it is easy to make the depth of the above substrate reference mark 510 larger than the one according to the first embodiment. Consequently, since the depth of the aliminum film 133 can be enlarged, it can be easier to detect the misalignment of the above edge 133a of the alminum film 133 by the alignment error measuring equipment.

Third Embodiment

The third embodiment of the present invention will be explained, using the FIG. 7 and FIG. 8, as below.

Figure 7:
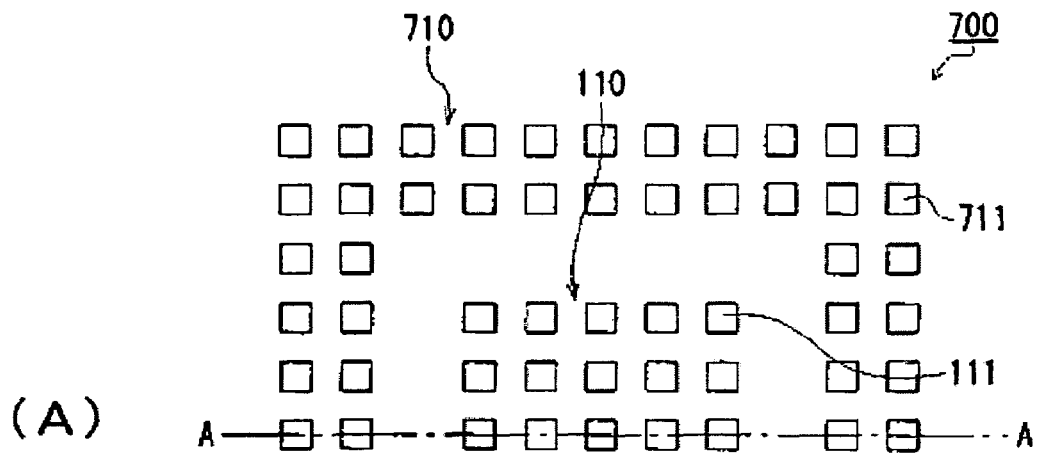
FIG. 7 is a schematic diagram showing a configuration of an alignment error measuring mark in accordance with the third embodiment of the invention. The figure of (A) is a top-view diagram. The figure of (B) is an A-A cross section.
Figure 7:
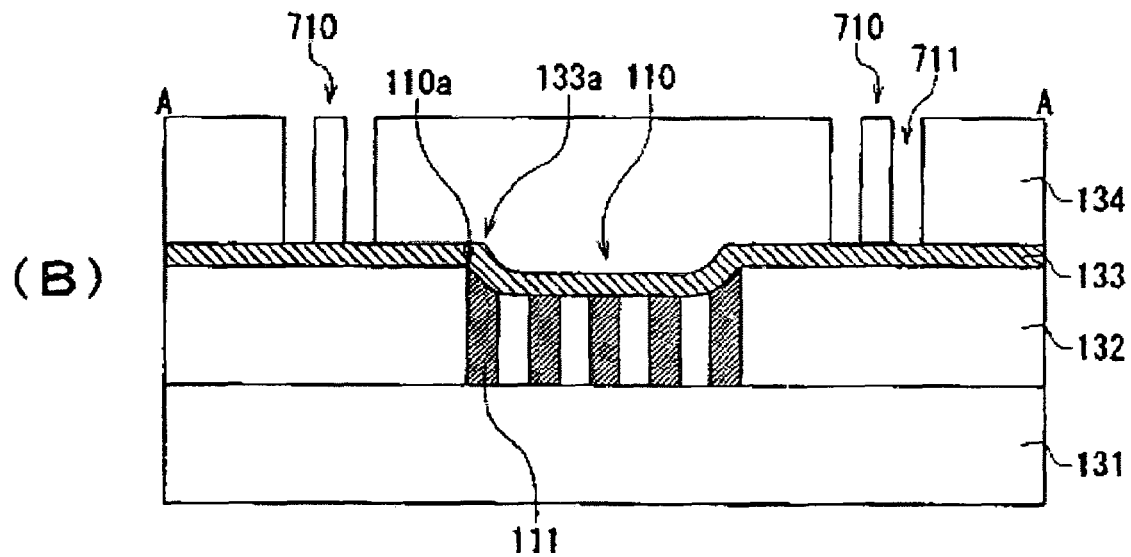

FIG. 7 is a schematic diagram showing a configuration of an alignment error measuring mark in accordance with the third embodiment of the invention. The figure of (A) is a top-view diagram. The figure of (B) is an A-A cross section. In FIG. 7, the elements having the same numerical as in FIG. 1 are identical to the ones of FIG. 1. As shown in FIG. 7, compared with the first embodiment, it is the different point that the resist reference mark 710 of the alignment error measuring mark 700 is acquired by forming the plural of marks for resist reference mark on the resist film 134 at the given density.

The resist reference mark 710 is formed in the resist film 134 on the substrate reference mark 110 in the rectangular shape. The resist reference mark 710 according to the third embodiment has the lager size than the size of the substrate reference mark 110, as in the first embodiment. The size of the resist reference mark 710 is not limited to a special size, however, the size of from 70 um to 80 um is preferable in order to use directly the conventional alignment error measuring equipment, and the size difference to the substrate reference mark 110 of more than 10 um is preferable.

Furthermore, as explained before, the resist reference mark 710 according to the third embodiment is produced by forming a plural of hole for the resist reference mark 711 at the predetermined density on the resist film 134. Additionally, to simplify the explanation in FIG. 7, the holes 711 is assumed to have two columns, however, forming more holes 711 at the predetermined density is preferable, actually. The size, the interval, and the shape, etc., of the holes 711 is not limited, although, the above items thereof are determined to the extent so that the intensity of signal peak during measuring by the alignment error measuring equipment can be the same as the signal peak intensity of the holes for the substrate reference mark 111 (as explained below). For example, the size and the interval thereof can be conformed to the smallest semiconductor manufacturing process rule (for example, 0.3 um), as well as the holes for substrate reference mark 711 and the holes for the resist reference mark 711, and the top view shape thereof can be rectangular or circular.

Since the manufacturing method according to the third embodiment is the same as the above mentioned method according to first embodiment, the explanation thereof is omitted.

Figure 8:
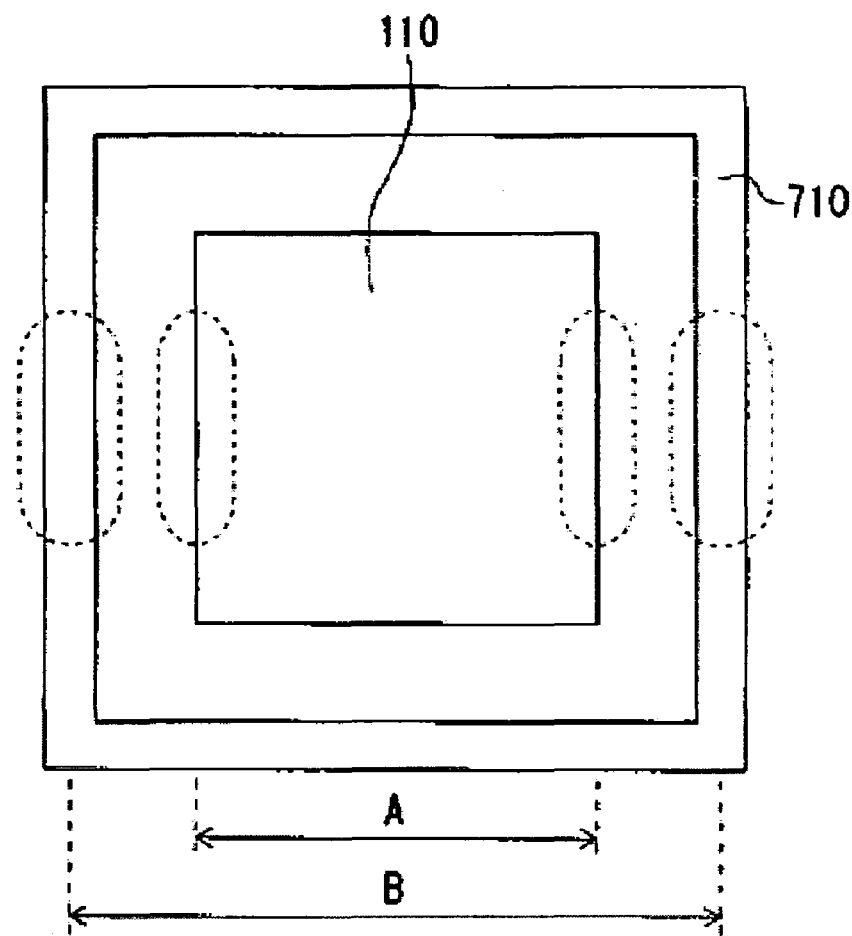
FIG. 8 is a schematic diagram for explanation of a measuring method for alignment error in accordance with the third embodiment of the invention.
Figure 8:
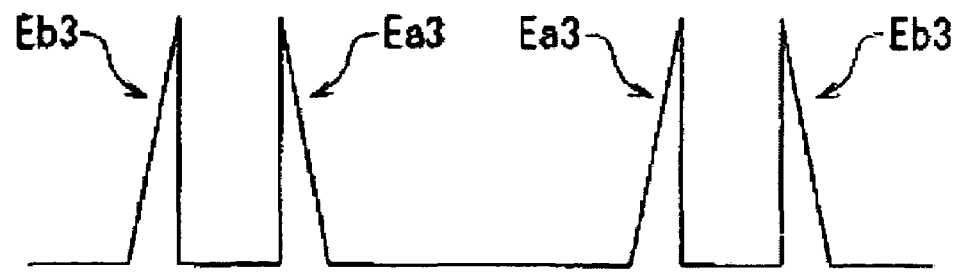

FIG. 8 is a schematic diagram for explanation of a measuring method for misalignment between the substrate reference mark 110 and the resist reference mark 710 in the X axis direction.

As shown in FIG. 8, the signal peak Ea3, Ea3 corresponding to the edge 133a of the alminum film 133 and the signal peak Eb3, Eb3 corresponding to the resist reference mark 710 are observed by the alignment error measuring equipment. As in the first embodiment, since the edge 133a of the alminum film 133 is formed actually in the same position as the edge 110a of the substrate reference mark 110 in the third embodiment, the X axis center of the substrate reference mark 110 is represented as A/2, and the X axis center of the resist reference mark 710 is represented as B/2. Consequently, the difference between the A/2 and the B/2 is the X-axis-misalignmnet delta X of the resist reference mark 710.

According to the third embodiment, since the substrate 110 is produced by forming the plural of holes for the substrate reference mark 111 and the resist reference mark 710 is produced by forming the plural of holes for the resist reference mark 711, the optical intensity of the signal peak Ea3 corresponding to the substrate reference mark 110 is approximately the same as the optical intensity of the signal peak Eb3 corresponding to the resist reference mark 710. The precision of the alignment error measuring equipment can be improved by setting the above optical intensities of signal peak Ea3, Eb3 to approximately the same level. However, when the optical intensity difference between Ea3 and Eb3 is large, it becomes difficult to set the threshold for detecting accurately the points of the both signal peak Ea3 and Eb3. On the contrary, according to the third embodiment, the optical intensities of the signal peak Ea3, Eb3 have approximately the same levels, then the points of the signal peak Ea3, Eb3 can be accurately detected. Consequently, the precision of the alignment error measuring equipment can be improved.

Regarding the Y axis direction, the misalignment delta Y of the resist reference mark 710 can be detected in the same way as in the above mentioned way. In the case thereof, both of the optical intensity of the signal peak Ea3 corresponding to the substrate reference mark 110; and the optical intensity of the signal peak Eb3 corresponding to the resist reference mark 710 have approximately the same levels.

The aligner for photolithography of the resist film 134 is adjusted, using the above mentioned measuring results, the delta X and the delta Y. Therefore, the further alignment precision of the photolithography of the semiconductor wafer thereof can be maintained.

Forth Embodiment

The forth embodiment of the invention will be explained as below, using FIG. 9 and FIG. 10.

Figure 9:
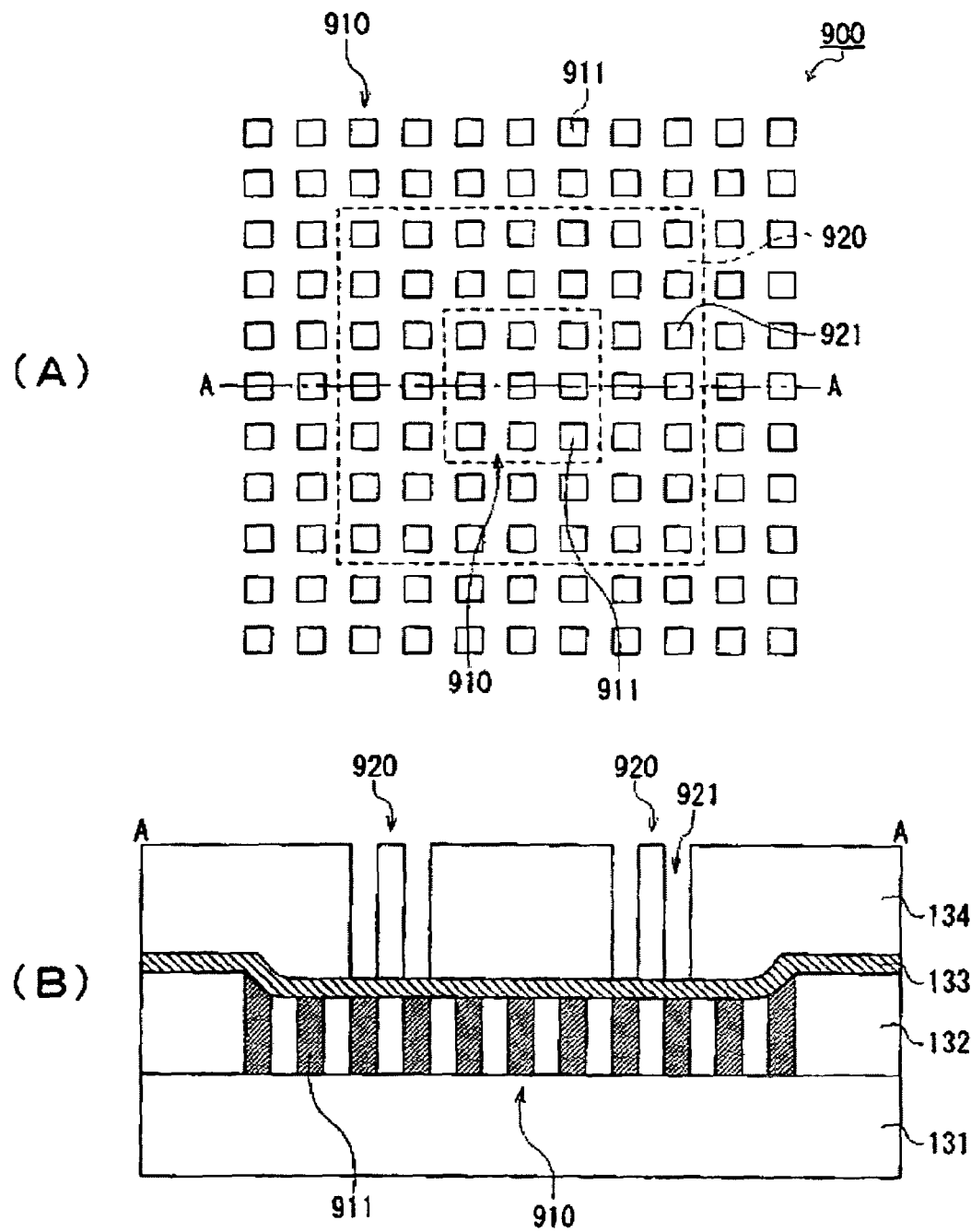
FIG. 9 is a schematic diagram showing a configuration of an alignment error measuring mark in accordance with the forth embodiment of the invention. The figure of (A) is a top-view diagram. The figure of (B) is an A-A cross section.

FIG. 9 is a schematic diagram showing a configuration of an alignment error measuring mark in accordance with the third embodiment of the invention. The figure of (A) is a top-view diagram. The figure of (B) is an A-A cross section. In FIG. 9, the elements having the same numerical as in FIG. 5 are identical to the ones of FIG. 5. As shown in FIG. 9, compared with the first embodiment, it is the different point that the outer edge size of a resist reference mark 920 of an alignment error measuring mark 900 is smaller than the size of a substrate reference mark 910 of the alignment error measuring mark 900 and the resist reference mark 920 of the alignment error measuring mark 900 is acquired by forming a plural of marks for resist reference mark 921 on the resist film 134 at the given density.

As in the first embodiment, the substrate reference mark 910 can be formed by a concavity in the rectangular region caused by an erosion arising when a chemical mechanical polishing is done to the tungsten of the surface of the interlayer film 132 after the interlayer film 132 is formed on the semiconductor wafer 131, a plural of holes for substrate reference mark 911 is formed in the predetermined region of the above interlayer film 132 at the given density, and the tungsten is deposited in the above plural of holes for substrate reference mark 911 and on the above interlayer film 132. The size of the substrate reference mark 910 is not limited, however, the size of, for example, from 70 um to 80 um is preferable in order to use directly the conventional alignment error measuring equipment. Additionally, as in the first embodiment, the size, the interval, and the shape, etc., of the holes 911 can be determined so that an erosion is caused by the chemical mechanical polishing, although, for example, the size and the interval thereof can be conformed to the smallest semiconductor manufacturing process rule (for example, 0.3 um), and the top view shape thereof can be rectangular or circular.

The resist reference mark 920 is formed in the resist film 134 on the substrate reference mark 920 in the rectangular shape. As explained before, the resist reference mark 920 according to the forth embodiment has the smaller size than the size of the substrate reference mark 910. The size of the resist reference mark 920 is not limited to a special size, however, the size of from 30 um to 70 um is preferable in order to use directly the conventional alignment error measuring equipment, and the size difference to the substrate reference mark 510 of more than 10 um is preferable.

Furthermore, as explained before, the resist reference mark 910 according to the forth embodiment is produced by forming a plural of hole for the resist reference mark 921 at the predetermined density on the resist film 134. Additionally, to simplify the explanation in FIG. 9, the holes 921 is assumed to have two columns, however, forming more holes 921 at the predetermined density is preferable, actually. The size, the interval, and the shape, etc., of the holes 921 is not limited, although, the above items thereof are determined to the extent so that the intensity of signal peak during measuring by the alignment error measuring equipment can be the same as the signal peak intensity of the holes for the substrate reference mark 911 (as explained below). For example, the size and the interval of the holes 921 can be conformed to the smallest semiconductor manufacturing process rule (for example, 0.3 um), as well as the holes for substrate reference mark 911 and the holes for the resist reference mark 921, and the top view shape of the holes 921 can be rectangular or circular.

Since the manufacturing method according to the fourth embodiment is the same as the above mentioned method according to the first embodiment, the explanation thereof is omitted.

Figure 10:
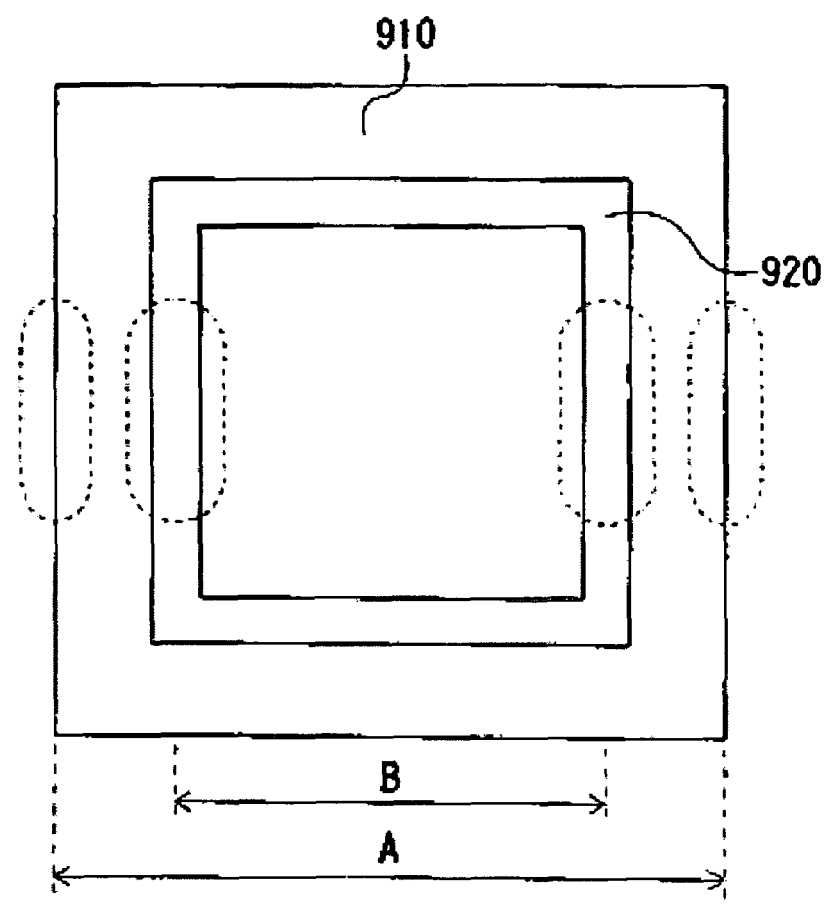
FIG. 10 is a schematic diagram for explanation of a measuring method for alignment error in accordance with the forth embodiment of the invention.
Figure 10:
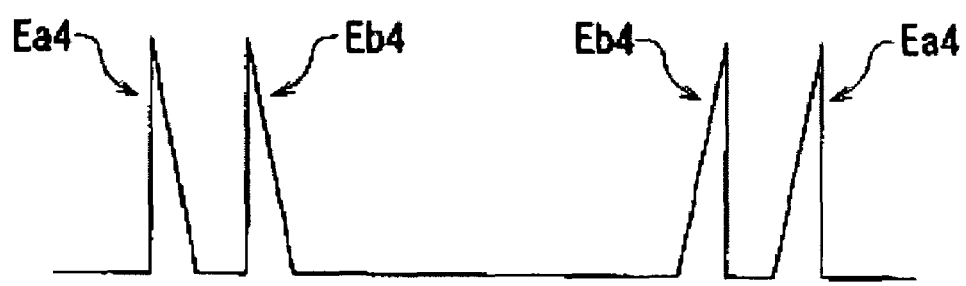
Figure 11:
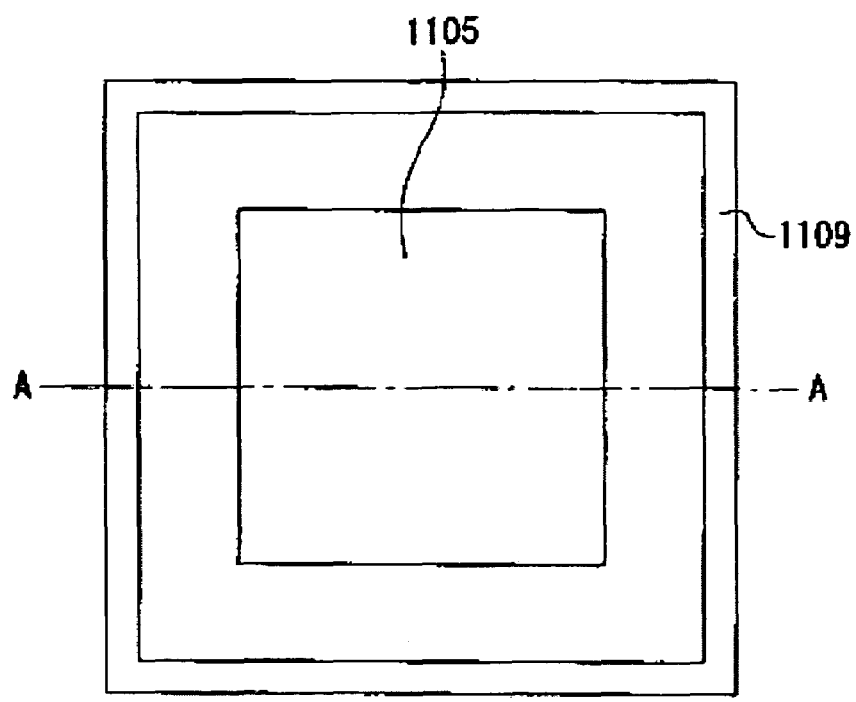
FIG. 11 is a schematic diagram showing a configuration of a conventional alignment error measuring mark. The figure of (A) is a top-view diagram. The figure of (B) is an A-A cross section.
Figure 11:
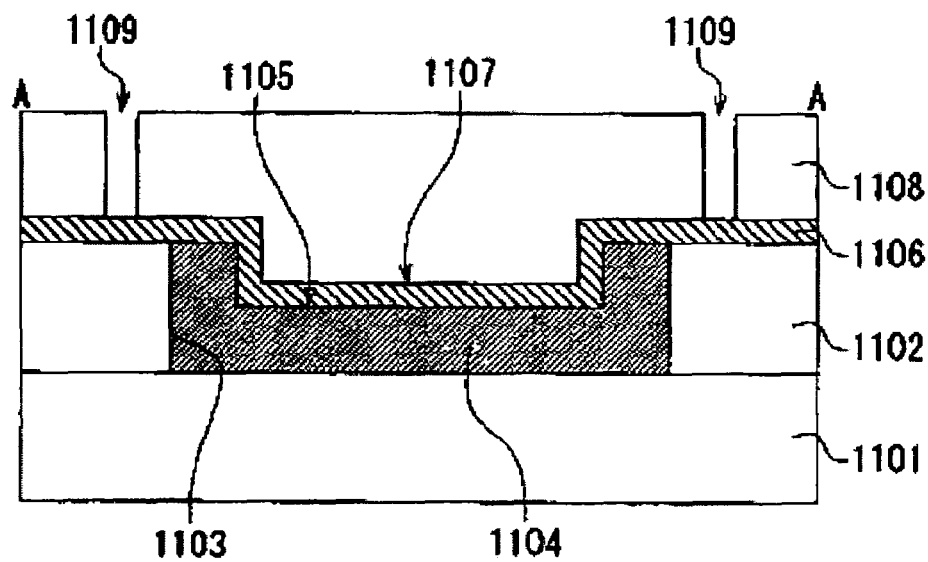
Figure 12:
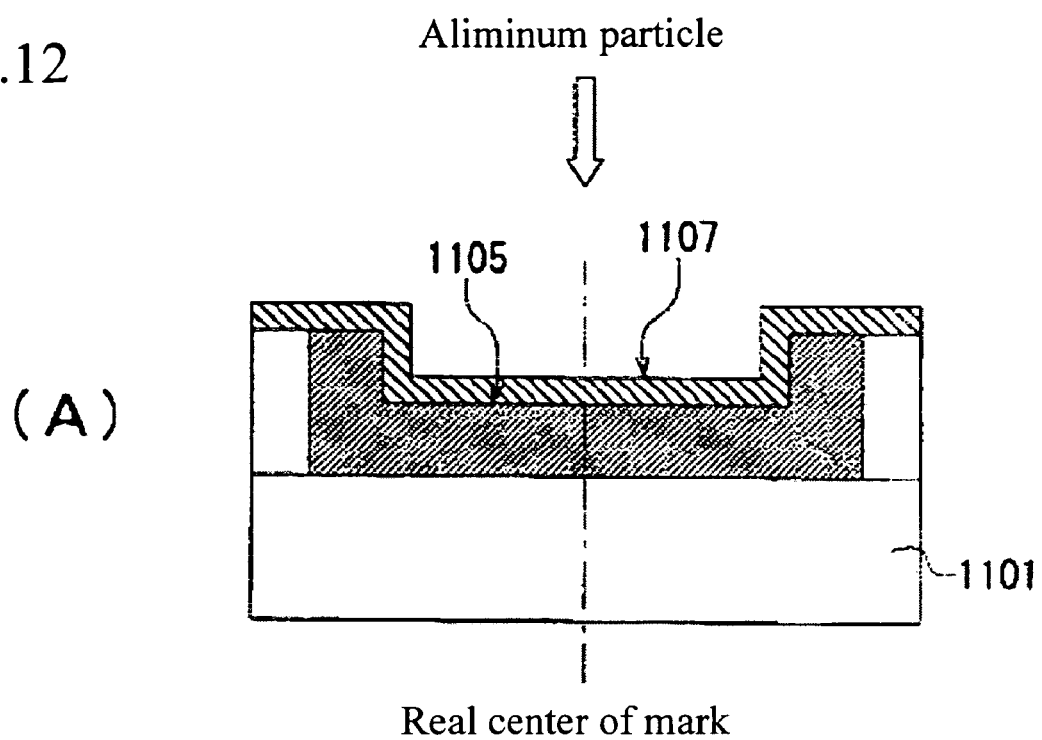
FIG. 12 is a schematic cross section diagram for explanation of the cause of error of a conventional alignment error measuring mark.
Figure 12:
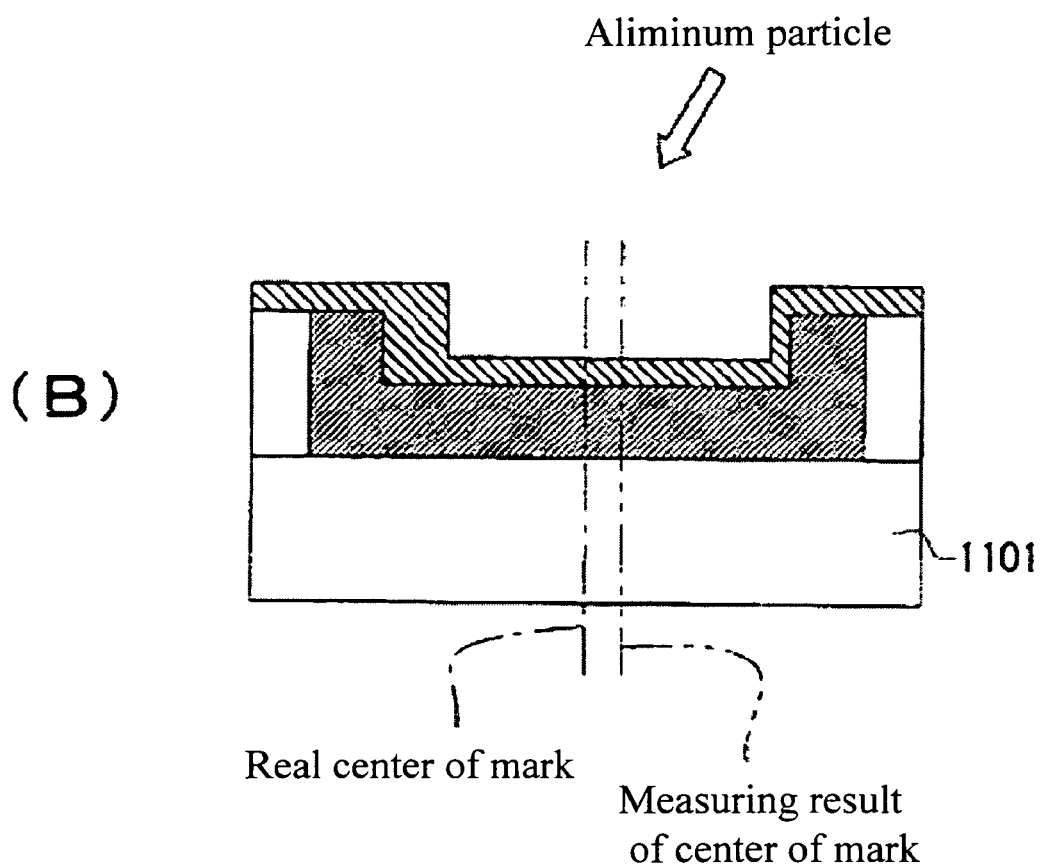

FIG. 10 is a schematic diagram for explanation of a measuring method for misalignment between the substrate reference mark 910 and the resist reference mark 920 in the X axis direction.

As shown in FIG. 10, the signal peak Ea4, Ea4 corresponding to the edge 133a of the alminum film 133 and the signal peak Eb4, Eb4 corresponding to the resist reference mark 920 are observed by the alignment error measuring equipment. As in the first embodiment, since the edge 133a of the alminum film 133 is formed actually in the same position as the edge of the substrate reference mark 910 in the forth embodiment, the X axis center of the substrate reference mark 910 is represented as A/2, and the X axis center of the resist reference mark 920 is represented as B/2. Consequently, the difference between the A/2 and the B/2 is the X-axis-misalignment delta X of the resist reference mark 920.

As shown in FIG. 10, according to the forth embodiment, since the substrate reference mark is formed by the plural of holes for the substrate reference mark 911 and the resist reference mark 920 is formed by the plural of holes for resist reference mark 921, the optical intensity of the signal peak Ea4 corresponding to the substrate reference mark 910 and the optical intensity of the signal peak Eb4 corresponding to the resist reference mark 920 have approximately same levels. Consequently, based on the same reasons as according to the third embodiment, the precision of the alignment error measuring equipment can be improved.

Regarding the Y axis, the misalignment delta Y of the resist reference mark 920 can be detected in the same way as the above mentioned one. In the case thereof, the optical intensity of the signal peak corresponding to the substrate reference mark 910 and the optical intensity of the signal peak corresponding to the resist reference mark 920 have approximately same levels.

The aligner for photolithography of the resist film 134 is adjusted, using the above measuring results, the delta X and the delta Y. Therefore, the further alignment precision of the photolithography for semiconductor wafers can be maintained.

According to the forth embodiment, as the first embodiment, since the concavity formed by the erosion is used as the substrate reference mark 910, there is very few misalignment between the above substrate reference mark 910 and the alminum film 133. Consequently, the highly precise alignment error measuring can be practicable.

Furthermore, in comparison of the forth embodiment with the first embodiment, it is easy to enlarge the size of the substrate reference mark 910, therefore, it can be easy to detect the edge 133a of the alminum film 133 by the alignment error measuring equipment.

Additionally, according to the forth embodiment, the optical intensity of the signal peak Ea4 corresponding to the substrate reference mark 910 and the optical intensity Eb4 of the signal peak corresponding to the resist reference mark 920 can have approximately same levels. Form the point thereof, the precision of the alignment error measuring equipment can be improved.

According to from the first to the forth embodiment, the case where the substrate reference mark is formed in the same layer as the contact hole is taken as an example for the description, however, it is obvious that the substrate reference mark can be formed other layer, for example, such as through hole layer, etc.

What is claimed is:

1. An alignment error measuring mark, comprising;
    a plurality of holes formed in a predetermined rectangular region of an interlayer film at a given density;
    a substrate reference mark disposed in the predetermined rectangular region, and which includes a conductive material filling the holes, and a concavity formed in the interlayer film and over the plurality of holes and in the predetermined rectangular region; and
    a resist reference mark being formed in a resist film disposed on said substrate reference mark, the resist film being disposed over the interlayer film, the resist reference mark being at least one frame shaped hole having a rectangular frame shape that has a different size from a size of said substrate reference mark.

2. The alignment error measuring mark according to claim 1, wherein said resist reference mark has a larger size than an outer edge size of said substrate reference mark.

3. The alignment error measuring mark according to claim 1, wherein said resist reference mark has a smaller size than the outer edge size of said substrate reference mark.

4. The alignment reference mark according to claim 1, wherein said resist reference mark is produced by forming a plurality of holes for said resist reference mark on said resist film at a predetermined density.

5. A method for manufacturing semiconductor comprising;
    a first process for forming a hole for interlayer wiring in an interlayer film on a semiconductor substrate and for forming a plural of holes for a substrate reference mark at a given density in a predetermined rectangular region of said interlayer film;
    a second process for depositing a first conductive material in said hole for interlayer wiring, in said plural of holes for a substrate reference mark, and on said interlayer film;
    a third process for removing said first conductive material being deposited on the surface of said interlayer film by chemical mechanical polishing and for forming a substrate reference mark having a concavity shape in said rectangular region by erosion caused by said chemical mechanical polishing;
    a forth process for depositing a second conductive material in said hole for interlayer wiring, in said plural of holes for a substrate reference mark, and on said interlayer film;
    a fifth process for forming a resist film on said the film of said second conductive material;
    a sixth process for forming a mask for processing said film of said second conductive material; from said resist film using photolithography method, and for forming a resist reference mark having a rectangular frame shape and having different size from said the size of said substrate reference mark; from said resist film on said substrate reference mark using photolithography method; and
    a seventh process for detecting a alignment error of said etching mask by measuring a misalignment between said substrate reference mark and said resist reference mark.

6. The alignment reference mark according to claim 2, wherein said resist reference mark is produced by forming a plurality of holes for said resist reference mark on said resist film at a predetermined density.

7. The alignment reference mark according to claim 3, wherein said resist reference mark is produced by forming a plural of holes for said resist reference mark on said resist film at a predetermined density.

* * * * *